United States Patent [19]
Brooks

[11] Patent Number: 5,463,346
[45] Date of Patent: Oct. 31, 1995

[54] FAST RESPONSE LOW-PASS FILTER

[75] Inventor: James R. Brooks, Beaverton, Oreg.

[73] Assignee: SpaceLabs Medical, Inc., Redmond, Wash.

[21] Appl. No.: 224,644

[22] Filed: Apr. 7, 1994

[51] Int. Cl.[6] .................................................. H03H 11/04
[52] U.S. Cl. ............................ 327/553; 327/558; 327/63
[58] Field of Search ..................... 330/107, 109, 330/303, 305; 327/558, 551, 552, 553, 47, 40, 44, 72, 78, 63; 333/17.1, 174

[56] References Cited

U.S. PATENT DOCUMENTS

| | | | |
|---|---|---|---|
| 3,757,236 | 9/1973 | Langan | 327/47 |
| 4,302,738 | 11/1981 | Cabot et al. | 333/17.1 |
| 4,818,903 | 4/1989 | Kawano | 327/553 |
| 4,851,719 | 7/1989 | Hitomi | 327/553 |
| 5,200,716 | 4/1993 | Amano | 333/12.1 |

*Primary Examiner*—Timothy P. Callahan
*Assistant Examiner*—Dinh T. Le
*Attorney, Agent, or Firm*—Seed and Berry

[57] ABSTRACT

A fast response, low-pass filter comprising a slow response low-pass filter and a fast response low-pass filter. Both of these low-pass filters receive an input signal, and their respective outputs are compared to each other. When the output of the slow response filter differs from the output of the fast response filter by a predetermined value, the response time of the slow response time filter is increased so that it can more rapidly follow the input signal. The fast response time low-pass filter can be implemented with either analog low-pass filters or by digital low-pass filters.

18 Claims, 5 Drawing Sheets

FAST RESPONSE LOW-PASS FILTER

TECHNICAL FIELD

This invention relates to low-pass filters for attenuating the high-frequency components of a signal, and more particularly to a low-pass filter that is capable of responding to rapid and substantial changes in the amplitude of an input signal.

BACKGROUND OF THE INVENTION

A wide variety of instruments exist that display a measured parameter by displaying a voltage that is proportional to the measured parameter. For example, in the field of patient monitoring, sensors are often used that provide a voltage that is indicative of a physiological parameter that is being measured. The sensor is connected to a monitor that provides a digital readout of the sensor voltage, and hence the value of the measured physiological parameter. The voltage output by the sensor is essentially a DC voltage that changes in accordance with changes of the measured physiological parameter. However, for a variety of reasons, the DC voltage often contains a small AC component, known as ripple. While the ripple does not normally degrade the accuracy of the measurement to any significant degree, the ripple does make it difficult to read the measured parameter because the digital display responds to the ripple. Thus, for example, for a measured heart rate of 75, the display might jump rapidly back and forth through the three heart rate values 74, 75 and 76. This rapid changing of the display—known as "display jitter"—makes it difficult to read any of the three displayed values.

In the past, attempts have been made to prevent the monitor from responding to ripple by filtering the ripple using a low-pass filter. While a low-pass filter can attenuate ripple sufficiently to avoid display jitter, it often creates an additional problem for which there has been no satisfactory solution. Specifically, passing the voltage from a sensor through a low-pass filter limits the slew rate, i.e., the rate at which the filter can respond to changes in the input signal. Thus, while a low-pass filter having a sufficiently low cutoff frequency can eliminate ripple, it also limits the ability of the filter to respond to rapid and substantial changes in the input voltage. As a result, the monitor does not respond to changes in the physiological parameter as rapidly as they occur and are measured by the sensor. Instead, a sudden change in the measured physiological parameter is perceived on the monitor as a slow change in the physiological parameter. Thus, during these rapid and/or substantial changes in the physical parameter, the monitor does not accurately display the value of the measured physiological parameter.

In the past, there has been no satisfactory solution to the problem of eliminating display jitter induced by ripple and still allowing a monitor to accurately respond to the true value of a physiological parameter. Instead, it was always necessary to trade off display jitter with display response time.

SUMMARY OF THE INVENTION

The primary object of the invention is to provide a low-pass filter that is capable of adequately filtering ripple and other high-frequency signals while allowing the filter to respond to relatively rapid and substantial changes in the signal to be filtered.

These and other objects of the invention are provided by a fast response low-pass filter formed by first and second low-pass filters each of which receive a common input signal and output a respective output signal. The first filter has a relatively high cutoff frequency so that it accurately follows the input signal but fails to significantly attenuate ripple. The second filter has a cutoff frequency that is changed from a relatively low frequency to a relatively high frequency in response to a control signal. When the cutoff frequency of the second filter is relatively low it effectively attenuates ripple, although it may not always respond fast enough to accurately follow the input signal. When the cutoff frequency of the second filter is relatively high it, like the first filter, fails to significantly attenuate ripple, although it accurately follows the input signal. A comparator connected to the first and second filters compares the respective values of the first and second output signals to each other and generates the control signal when either their difference or the absolute value of their difference exceeds a predetermined value. As a result, the fast response low-pass filter has a relatively low cutoff frequency to attenuate ripple until the input signal changes at a sufficient rate to cause the comparator to generate the control signal. The response time of the second filter then changes to the relatively high cutoff frequency so that it can accurately follow the input signal. The fast response low-pass filter may be implemented using either analog circuitry or digital filtering techniques.

Regardless of which technique is used, the comparator may generate the control signal to change the cutoff frequency from the relatively low frequency to the relatively high frequency when the difference between the first and second output signals is greater than a first predetermined value. Similarly, the comparator may terminate the control signal to change the cutoff frequency from the relatively high frequency to the relatively low frequency when the difference between the first and second output signals is within a second predetermined value. The first predetermined value may be greater than the second predetermined value to provide hysteresis to the changing of the cutoff frequency between the relatively high frequency and the relatively low frequency.

BRIEF DESCRIPTION OF THE DRAWINGS

FIG. 7 is a block diagram of a presently preferred embodiment of the inventive filter implemented with digital circuitry.

DETAILED DESCRIPTION OF THE INVENTION

Figure 1:
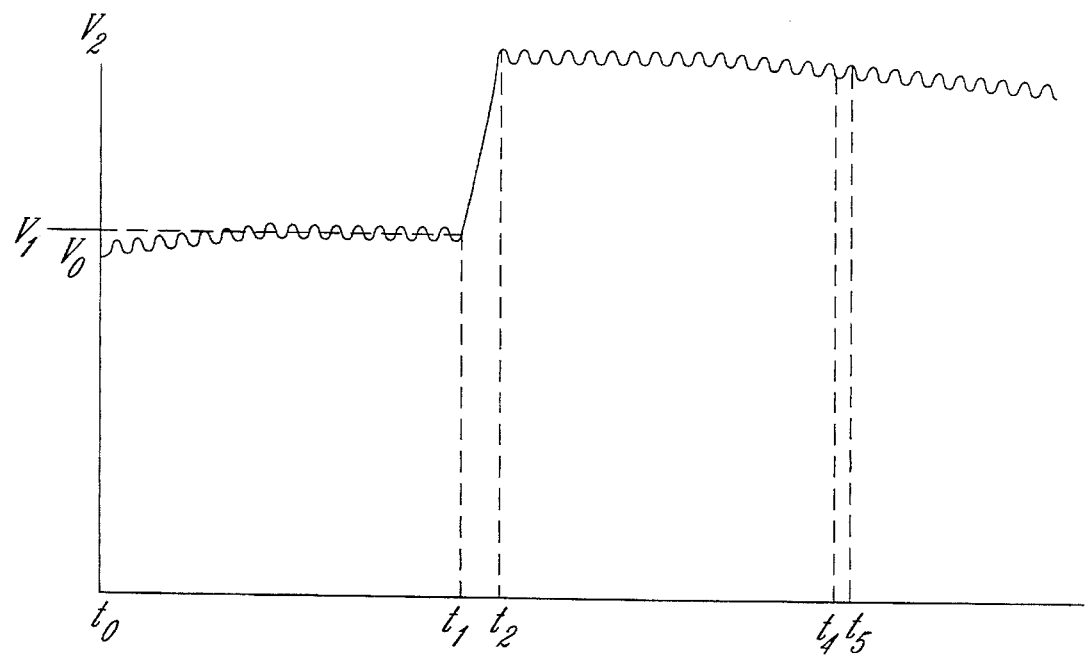
FIG. 1 is a waveform diagram of a signal that can be advantageously filtered with the inventive fast response time low-pass filter.

Although the inventive fast response time, low-pass filter can advantageously be used to filter virtually any type of signal having both high-frequency and low-frequency spectral components, an example of a signal that can be advantageously filtered with the inventive filter is illustrated in FIG. 1. The signal is shown starting at time to with a relatively large amplitude of $V_0$, and then gradually increasing to a voltage $V_1$ at a time $t_1$. The signal then undergoes a rapid and fairly substantial increase in voltage to voltage $V_2$ at the time $t_2$. Thereafter, the voltage remains fairly constant although it initially increases slightly and then decreases gradually. As shown in FIG. 1, a low-amplitude relatively high frequency spectral component, commonly referred to as ripple, is present in the signal along with the high amplitude, relatively low frequency spectral component corresponding to the gradual changes in the amplitude of the signal. Although the high frequency component is shown in FIG. 1 as being at a single relatively high frequency, it will be understood that the high frequency or AC signal may also be composed of multiple frequency components or even a continuous frequency spectrum, such as noise.

If it is assumed that the signal shown in FIG. 1 is indicative of a measured physiological parameter, such as heart rate, then a digital readout of the physiological parameter can be obtained by simply providing a digital readout of the voltage. However, because of the AC signal impressed on the DC heart rate signal, the digital readout of heart rate will not be constant. Instead, for example, at time $t_4$ (on the trough of the ripple signal) the heart rate might read 74, while an instant later at time $t_5$ (at the crest of the ripple signal) the heart rate might read 76. The jitter of the digital display resulting from the ripple makes it extremely difficult to read any number on the digital display.

Figure 2:
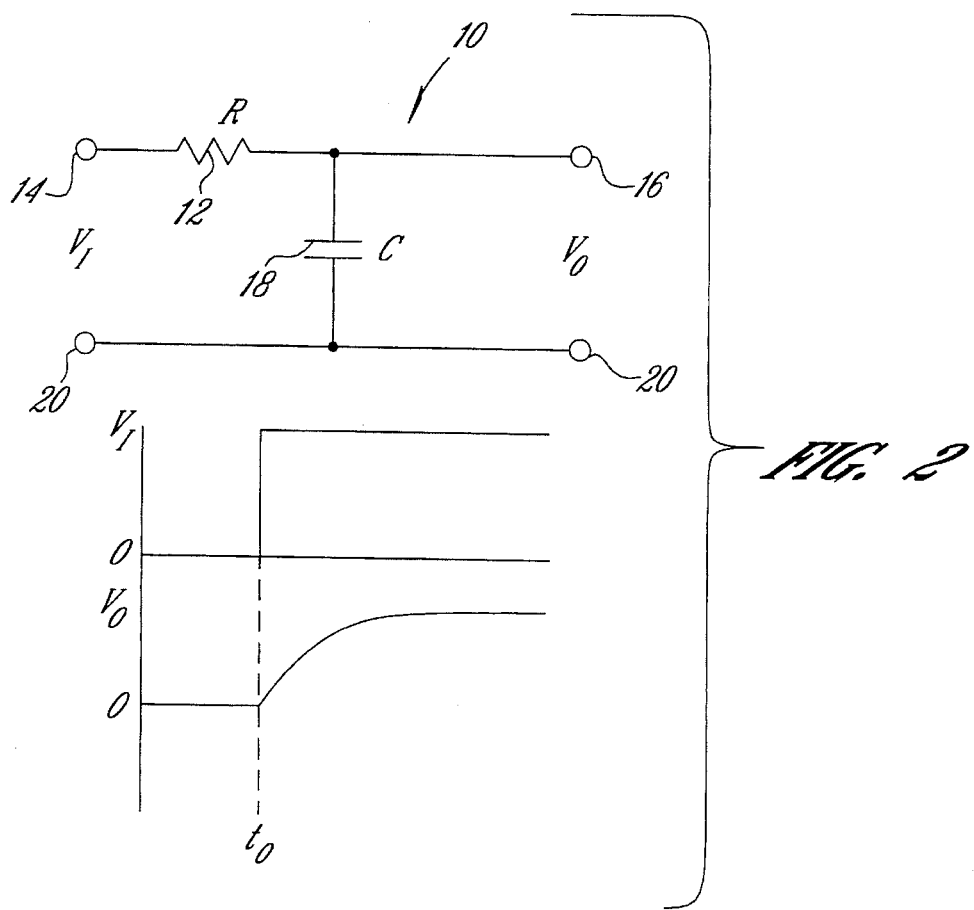
FIG. 2 is a schematic of a typical low-pass filter and a waveform diagram showing the waveforms input to and output from the filter.

A conventional low-pass filter can be used to filter the waveform of FIG. 1 in order to eliminate the ripple and hence the jitter on a digital display. With reference to FIG. 2, a simple low-pass filter 10 consists of a resistor 12 connected in series between an input terminal 14 and an output terminal 16, and a capacitor 18 connected between the output terminal 16 and a common ground terminal 20. As is well-known in the art, the transfer function of the filter 10 is fairly constant up until a cutoff frequency of the filter, and it then declines at the rate of 20 dB per decade thereafter. The cutoff frequency $f_c$ is given by the formula:

$$f_c = \frac{1}{2\pi RC}$$

where R is the resistance of the resistor 12 and C is the capacitance of capacitor 18.

Viewed in the time domain, the filter responds to a voltage step applied to its input as shown in the waveforms of FIG. 2. Specifically, at time $t_0$ the voltage applied between the input terminal 14 and the ground terminal 20 steps from 0 to $V_1$ volts, as shown in the upper waveform of FIG. 2. The voltage $V_1$ gradually charges the capacitor 18 through resistor 12 so that the output voltage between the output terminal 16 and the ground terminal 20 gradually increases as shown in the lower waveform of FIG. 2. The rate at which the output voltage responds to the voltage step applied to the input terminal 14 is a function of the time constant of the filter, which is equal to the product of the resistance of resistor 12 and the capacitance of capacitor 18. Mathematically, the time domain response of the filter is given by the formula:

$$V_0 = V_1(1 - e^{-\frac{t}{RC}})$$

Figure 3:
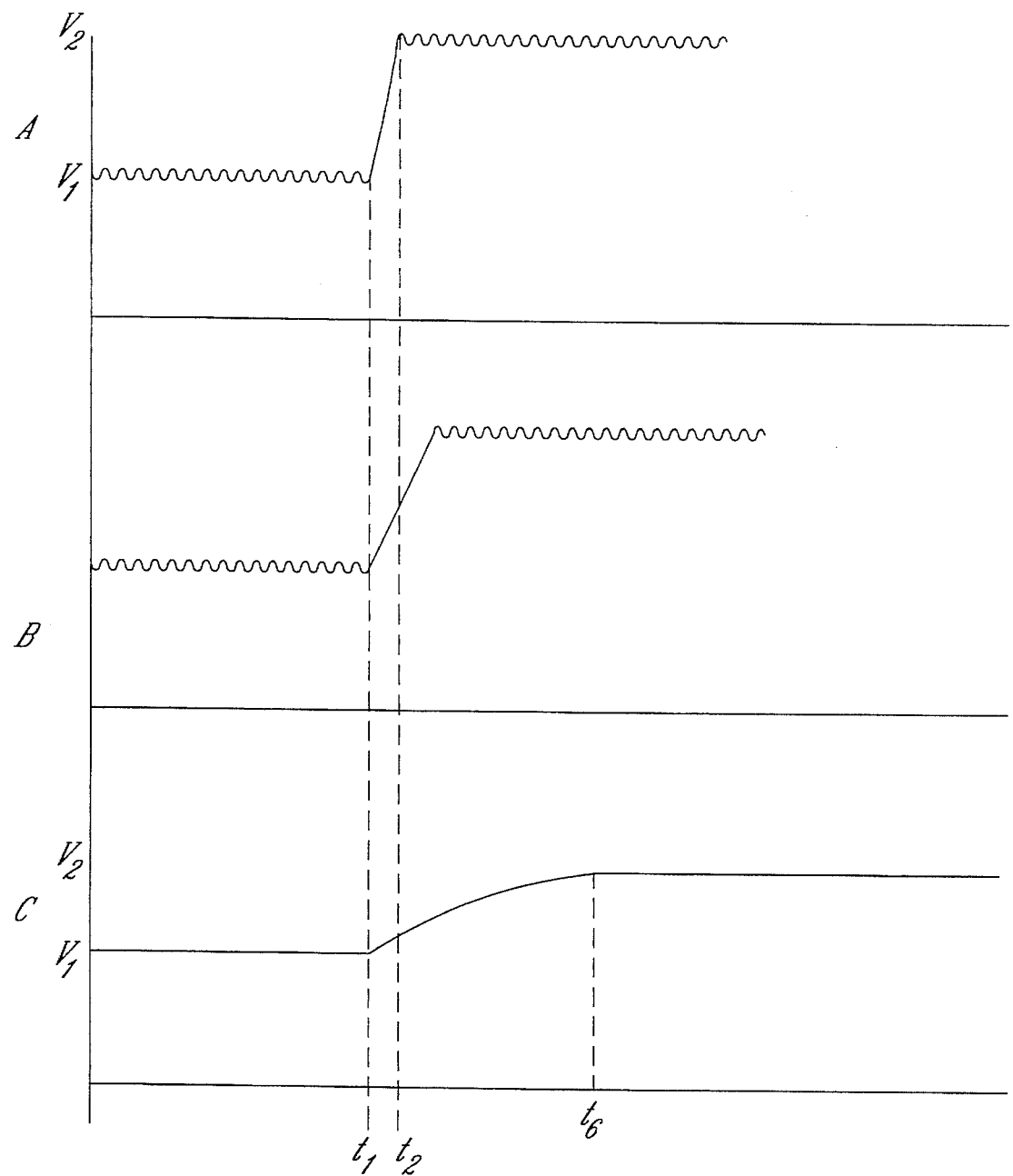
FIG. 3 are waveform diagrams showing the signal of FIG. 1 applied to and output from two conventional low-pass filters having different cutoff frequencies.

The response of two low-pass filters of the type shown in FIG. 2 to a signal that is similar to the signal shown in FIG. 1 is illustrated in FIG. 3. The input signal is shown as waveform "A" at the top of FIG. 3, the response of a low-pass filter having a relatively high cutoff frequency is shown as waveform B in the middle of FIG. 3, and the response of a low-pass filter having a relatively low cutoff frequency is shown as waveform C at the bottom of FIG. 3. As illustrated by waveform B in the middle of FIG. 3, the cutoff frequency of the filter is sufficiently high so that the output of the filter lags only slightly behind the input. However, the relatively high cutoff frequency allows the ripple to pass through the filter. As mentioned above, the ripple causes the digital display to jitter, thus making it difficult if not impossible to read the value of the measured parameter. As shown by the bottom waveform of FIG. 3, a low-pass filter having a cutoff frequency that is low enough to attenuate the ripple from the input signal reduces the response time of the filter so that the output signal no longer accurately follows the input signal. Instead, when the input signal jumps from $V_1$ to $V_2$ between times $t_1$ and $t_2$, the output of the low-pass filter does not rise from $V_1$ to $V_2$ until approximately $t_6$. As a result, if the input to the low-pass filter was indicative of a measured physiological parameter, the digital readout of the voltage at the output of the filter would fail to accurately indicate the value of the measured physiological parameter during the period between $t_1$ and $t_6$.

Figure 4:
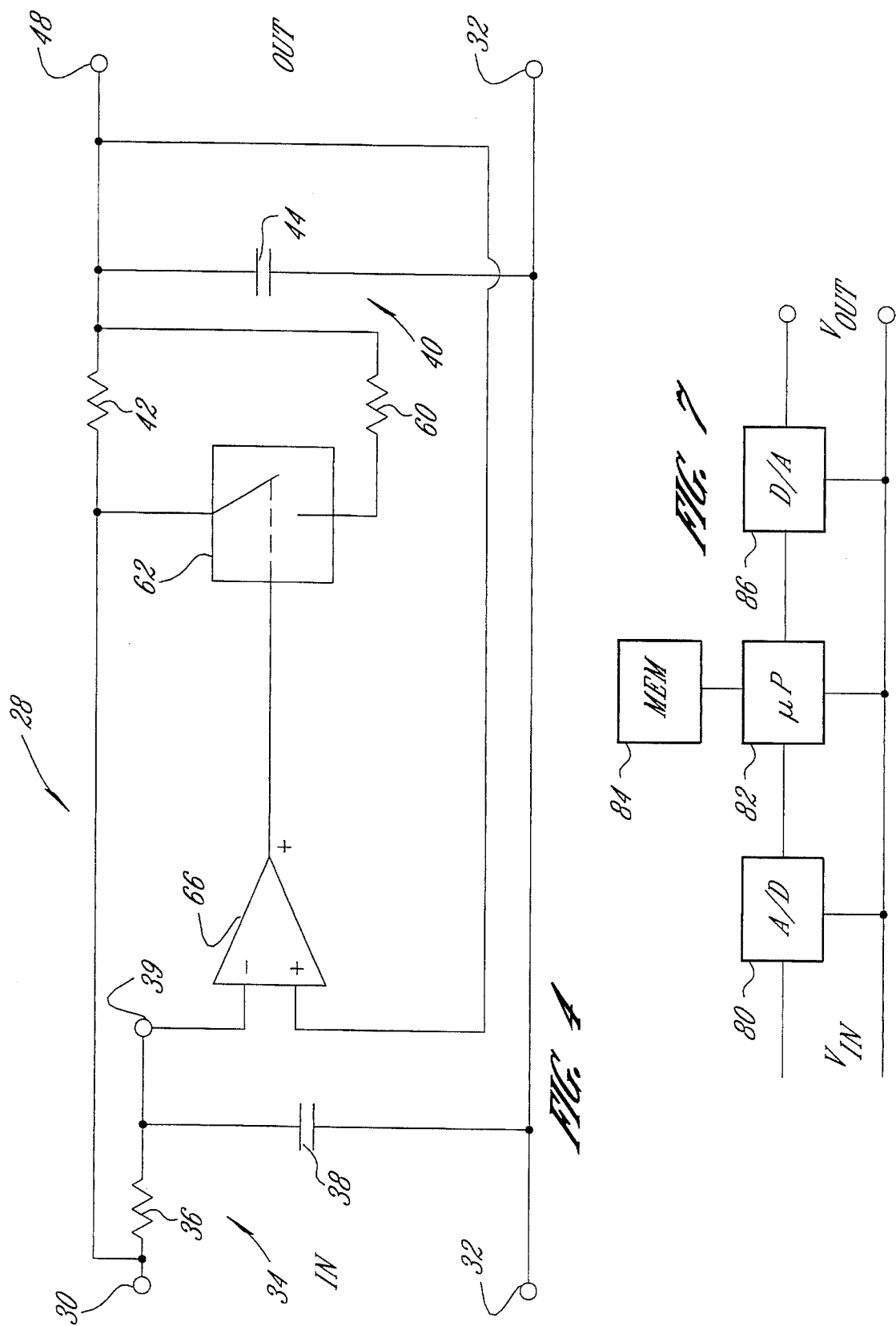
FIG. 4 is a schematic showing a presently preferred embodiment of the inventive filter implemented with analog circuitry.

A presently preferred embodiment of a fast response, low-pass filter 28 capable of attenuating ripple without limiting response time is illustrated in FIG. 4. As illustrated in FIG. 4, this embodiment is implemented using analog circuitry. The input signal is applied between input terminal 30 and a common ground terminal 32 to a first low-pass filter 34 consisting of a resistor 36 and a capacitor 38. The output of the filter 34 is present between output terminal 39 and the ground terminal 32. The input signal is also applied to a second low-pass filter 40 consisting of a resistor 42 and a capacitor 44. The output of the filter 40 between an output terminal 48 and the common ground terminal 32 constitutes the output of the fast response, low-pass filter 28.

The product of the resistance of resistor 36 and the capacitance of capacitor 38 is significantly smaller than the product of the resistance of resistor 42 and the capacitance of capacitor 44. As a result, the cutoff frequency of the low-pass filter 34 is significantly higher than the cutoff frequency of the low-pass filter 40. The voltage on the output terminal 39 of the filter 34 thus closely follows the input signal applied to input terminal 30, although it may also contain ripple that is present in the input signal. Since the filter 40 has a significantly lower cutoff frequency, the signal on the output terminal 48 does not contain any of the ripple that might be present on the signal applied to the input terminal 30. As a result, the output terminal 48 of the filter 40 is used as the output of the filter 28. However, in the event that there is a rapid change in the voltage applied to the input terminal 30, the voltage on terminal 48 would fail to follow the input. Under these circumstances, a resistor 60 would be connected in parallel with resistor 42 by a switch 62. The resistor 60 has a substantially smaller resistance than the resistance of resistor 42 so that the response time of the filter 40 is instantly increased to allow the filter 40 to respond to the input signal. The response time of the filter 40 when the switch 62 is closed may, but need not, be equal to the response time of the filter 34. The switch 62 is closed by the output of a comparator 64 which compares the output of filter 34 on terminal 39 with the output of the filter 40 on terminal 48. The comparator 64 is preferably a window comparator of conventional design that compares the absolute value of the difference between the output of filter 34 and the output of filter 40 with upper and lower thresholds. When the difference between these outputs exceeds an upper threshold, the comparator 64 closes the switch 62 to reduce the response time of the filter 40. When the difference between the outputs of the filters 34, 40 no longer exceeds a lower threshold, the comparator 64 opens the switch 62 to increase the response time of the filter 40 back to its original value. Thus, with the embodiment illustrated in FIG. 4, when the input signal of FIG. 1 rapidly increased at time $t_1$ and the filter 40 fails to follow this increase, the switch 62 would quickly close. The filter 40 would then accurately follow the input signal so that, at time $t_2$ when the output of the filter 40 became substantially equal to the output of the filter 34, the switch 62 would open, thereby allowing the filter 40 to thereafter filter ripple from the input signal.

Figure 5:
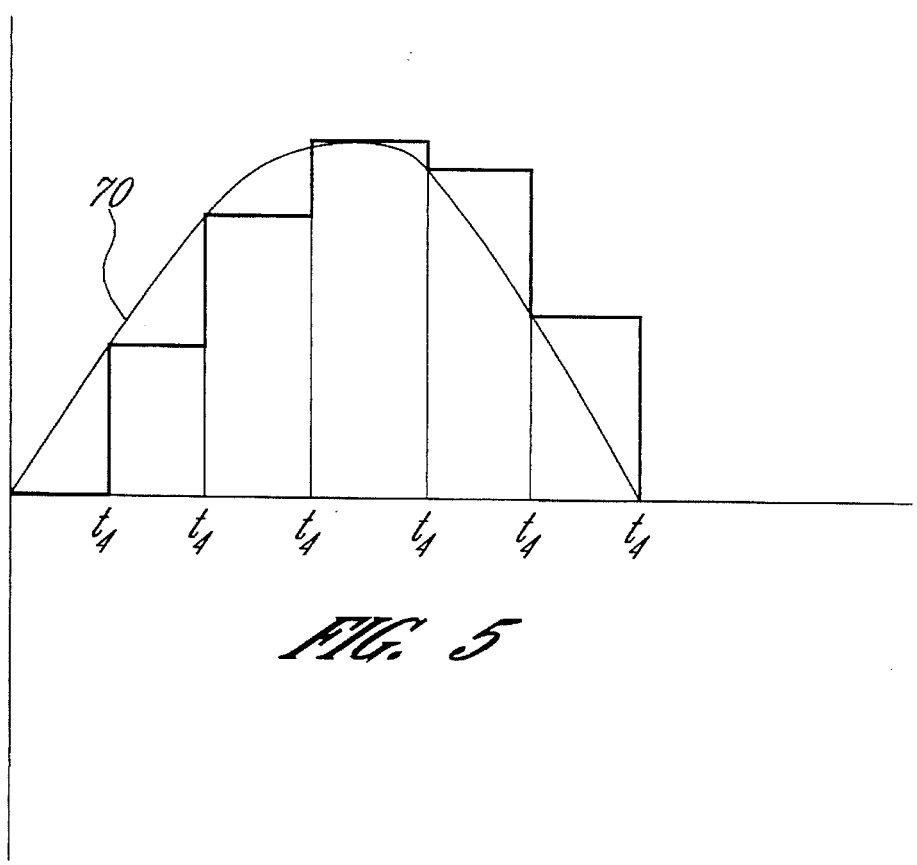
FIG. 5 is a waveform diagram showing the manner in which the sampling of a waveform approximates a series of voltage steps.

The inventive fast response, low-pass filter can also be implemented utilizing digital filtering techniques. As illustrated in FIG. 5, an input waveform 70 is sampled at times $t_1, t_2, \ldots t_6$. After each sample is taken, the value of the sample remains constant until the next sample is taken. Each of the samples thus creates a step waveform in which the voltage changes from the prior sample voltage to the voltage of the input waveform 70 when the sample is taken.

Figure 6:
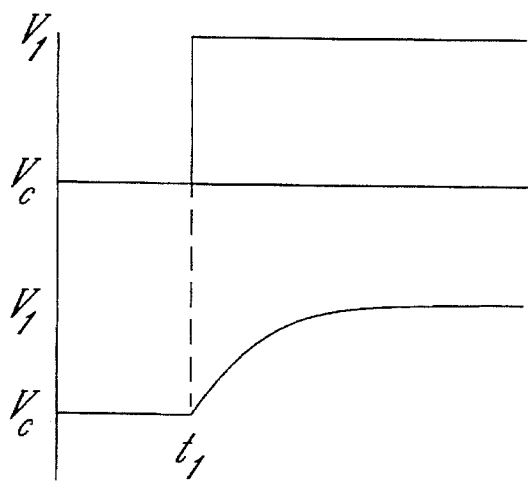
FIG. 6 is a waveform diagram showing the signal applied to and output from the filter of FIG. 2 when the capacitor contains a charge when the signal is applied to the filter.

The response of a low-pass filter to each of the samples is shown in FIG. 6. As shown in FIG. 6, the input voltage changes from $V_c$ (representing the voltage of the prior sample) to $V_1$ (representing the voltage of the current sample) The sample at the output of the low-pass filter responds as shown in the lower waveform of FIG. 6 by gradually increasing from $V_c$ to $V_1$ at time $t_1$. The voltage at the output of the filter $V_0$ is given by the formula:

$$V_0 = V_c + [(1 - 1^{-\frac{t}{RC}}) * (V_1 - V_c)]. \quad [1]$$

As mentioned above, the cutoff frequency $f_c$ of the filter 10 illustrated in FIG. 2 is given by the formula:

$$f_c = \frac{1}{2\pi RC} \quad [2]$$

where R is the resistance of the resistor 12 and C is the capacitance of the capacitor 18. This equation can be rearranged to:

$$RC = \frac{1}{2\pi F_c}. \quad [3]$$

Substituting equation [3] into equation [1] yields the equation:

$$V_0 = V_c + [(1 - 1^{-2\pi f_c t}) * (V_1 - V_c)]. \quad [4]$$

In a digitized system, the voltage $V_c$ is equal to $V_0$ from the previous sample. Sampling can also occur at a sufficient rate that the input voltage is essentially constant over the sample interval. Under these circumstances, the output voltage $V_{0_n}$ for sample n is given by the formula:

$$V_{0_n} = V_{0_{n-1}} + [(1 - 1^{-2\pi f_c t}) * (V_{I_n} - V_{0_{n-1}})] \quad [5]$$

where $V_{I_n}$ is the current input voltage sample. The term $1 - 1^{-2\pi f_c t}$ can be represented by the constant K since the time constant of the filter is substantially longer than the interval between samples. Under these circumstances, the output $V_{0_n}$ can be given by the formula $V_{0_n} = V_{0_{n-1}} + KV_{I_n} - KV_{0_{n-1}}$. Since the constant K will be a fraction having a value of between 0 and 1 which can be a problem in calculating using floating point arithmetic in a real time digitized system, the above equation can be rearranged to the equation:

$$\left(\frac{1}{K}\right)V_{0_n} = \left(\frac{1}{K}\right)(V_{0_{n-1}} + KV_{I_n} - KV_{0_{n-1}}) \quad [6]$$

which can be rearranged as follows:

$$\left(\frac{V_{0_n}}{K}\right) = \left(\frac{V_{0_{n-1}}}{K} + V_{I_n} - V_{0_{n-1}}\right). \quad [7]$$

If the term $$\left(\frac{1}{K}\right) \left(\text{i.e., } \frac{1}{(1 - 1^{2\pi f_c t})}\right)$$

is defined as the term M, the above equation can be rewritten as:

$$MV_{0_n} = MV_{0_{n-1}} + V_{I_n} - V_{0_{n-1}} \quad [8]$$

If the term SUM is now defined as: SUM=$MV_0$, then $V_0$=SUM/M. Combining these equations yields:

$$SUM_n = SUM_{n-1} + V_{I_n} - V_{0_{n-1}} \quad [9]$$

The variable SUM is thus the sum of the variable SUM from the prior sample and an incremental step equal to the difference between the current input to the filter and the output from the filter just prior to taking the current sample. The variable SUM is thus, in effect, the sum of all incremental steps that have previously occurred.

Assuming a sample rate of 1,000 samples per second, the inventive filter can be implemented with a 10 Hz fast response filter and a 1 Hz low response ripple filter as follows: the value t in the above equations is given by 1/1,000=0.001. For the fast response filter, M is calculated as $$\frac{1}{(1 - 1^{2\pi f_c t})} = \frac{1}{(1 - 1^{-2\pi * 10 * 0.001})} = 16.$$

M for the low response time ripple filter is calculated as $$\frac{1}{(1 - 1^{-2\pi * 10 * 0.001})} = 160.$$

The inventive fast response time, low-pass filter can also be implemented digitally as illustrated in FIG. 7. As illustrated in FIG. 7, the input signal is supplied to an analog-to-digital converter 80 which digitizes the input signal and applies it to a microprocessor 82. The operation of the microprocessor 82 is controlled by a set of instructions stored in memory 84. The memory 84 is also used for other purposes, as is conventional in the art. The microprocessor 82 calculates a value corresponding to the output of the filter and applies a corresponding byte to a digital-to-analog converter 86 which then outputs a voltage. By choosing appropriate sample times for the analog-to-digital converter 80 and appropriate operating times for the digital-to-analog converter 86, the output voltage $V_{OUT}$ accurately follows the input voltage $V_{IN}$ without passing ripple present on the input signal $V_{IN}$. Alternatively, the microprocessor 82 could simply drive digital display (not shown) to display the digital value of the low-pass filtered input or a graphic display (not shown) to plot the low-pass filtered value of the input signal.

Figure 8:
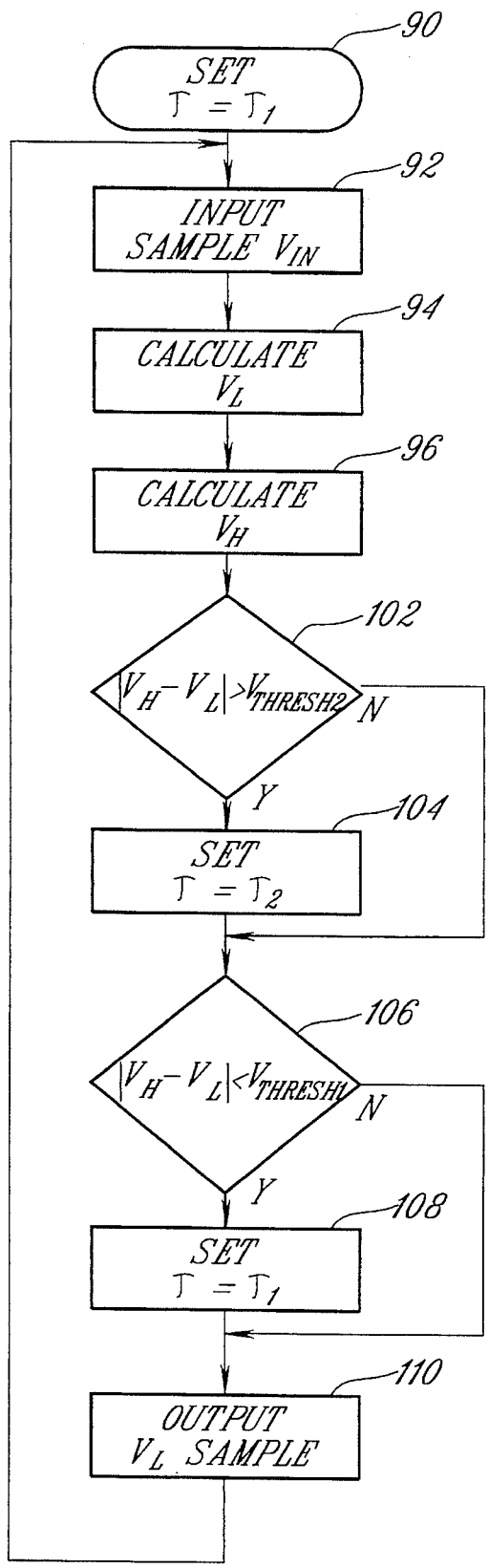
FIG. 8 is a flowchart of the software used to control a processor used in the embodiment of FIG. 7.

A flowchart of a program for controlling the operation of the microprocessor 82 is illustrated in FIG. 8. The time constant τ of the low response time filter is set to $\tau_1$ at step 90. The program next inputs a sample $V_{IN}$ from the analog-to-digital converter 80 (FIG. 7) at step 92. A slow response time filter output value $V_L$ and a fast response time filter output value $V_H$ are then calculated at steps 94 and 96, respectively, using the equations described above. The program then checks at 102 to determine if the value of the voltage output from the high-pass filter $V_H$ less the voltage at the output of the low-pass filter $V_L$ is greater than a first threshold $THRESH_1$. The threshold $THRESH_1$ corresponds to the voltage difference between the output of the fast response filter and the output of the slow response filter reaching a value that causes the slow response filter to switch to a fast response mode. If the voltage difference is greater than the threshold, the program branches to 104 where the time constant τ of the slow response filter is set to $\tau_2$. The program then checks at 106 to determine if the absolute value of $V_H$-$V_L$ is less than $THRESH_2$. The threshold $THRESH_2$ corresponds to a voltage at which the output of the slow response filter is sufficiently close to the output of the fast response filter that the slow response filter should be switched back to its slow response mode. If the outputs of the slow response filter and the fast response filter are sufficiently close to each other, the program branches to 108 at which point the time constant τ of the slow response filter is set to its slow response time constant $\tau_1$. The program then causes the microprocessor 82 to output an output sample $V_L$ to the digital-to-analog converter 86 corresponding to $V_L$ at 110 before looping back to step 92.

In operation, it is assumed that the slow response filter is accurately following the input voltage since the input voltage has not rapidly increased. The program accepts an input sample $V_{IN}$ at 92 and calculating output values $V_L$ and $V_H$ at steps 94 and 96, respectively. After branching from 102 to 106, and from 96 through 98 to set τ=$\tau_1$ (at which it was previously set), the program outputs a sample $V_L$ corresponding to the output voltage at 110. As soon as the low response filter fails to adequately follow the input signal, the program will branch from 102 to 104 to set the response time τ of the slow response filter to its fast response time constant $\tau_2$. The program will then branch from 106 directly to 110. When the input voltage returns to a relatively quiescent state, the output value $V_L$ of the slow response filter will become sufficiently close to the output value of the fast response filter $V_H$, particularly because of the now faster response time of the slow response filter. When this happens, the program will branch from 102 to 106 and from 106 directly to 110. When the difference between $V_H$ and $V_L$ becomes less than the threshold $THRESH_2$ (assuming $THRESH_2$ is less then $THRESH_1$), the program will branch from 102 to 106 and from 106 through 108 to 110 in order to return the time constant τ of the slow response filter to $\tau_1$.

The digital filter illustrated in FIG. 7 can also be implemented using the program shown in Table 1 in the C language. Note that in the program of Table 1 the output $V_{O_1}$ is the output of the fast response time filter and is used only internally. $V_{O_2}$ is the output of the variable response time filter and is used as the overall filter output.

TABLE 1

```
1  #define       fast_response_m                        16
2  #define       low_ripple_m                           160
3  #define low_ripple_to_fast_response_threshold        10
4  #define fast_response_to_low_ripple_threshold        2
5  int           sum1
6  int           vout1
7  int           sum2
8  int           vout2
9  int           vin
10 int           vout
11 int           vin
12 int           vout
13 int           fast_response_flag
14 void fast_response_low_ripple_filter (void)
   {
15     if(fast_response_flag == TRUE)
       {
16         if((abs(vout2 − vout1) < fast_response_to_low_ripple_threshold)
           {
17             fast_response_flag = FALSE;
18             sum2 = vout2 * low_ripple_m;
           }
       }
19     else
       {
20         if (abs(vout2 − vout1) > low_ripple_to_fast_response_threshold)
           {
21             fast_response_flag = TRUE;
22             sum2 = vout2 * fast_response_m;
           }
       }
23     sum1 = sum1 + vin − vout1;
24     vout1 = sum1/fast_response_m;
25     sum2 = sum2 + vin − vout2;
26     if(fast_response_flag == TRUE)
```

TABLE 1-continued

```
27          vout2 = sum2/fast_response_m;
            }
28      else
            {
29          vout2 = sum3/low_ripple_m;
            }
    }
```

The response time M of the fast response filter is defined at line 1 as 16, and the response time M of the low response time filter is defined at line 2 as 160. At line 3, the point for switching the low response time filter to its fast response time mode is set to 10 so that whenever the difference between $V_{OUT_2}$ and $V_{OUT_1}$ is greater than 10, the response time of the low response time filter is increased. The value for switching the low response time filter from its high response time mode back to its low response time mode is set to 2 at line 4. Memory is preserved for various variables between lines 5 and 13, and the void statement at line 14 is used to provide a name for the routine that can be called by other programs.

The IF statement at line 15 checks to see if the slow response filter is in its fast mode. If so, the fast response flag has been set TRUE, and the program checks at line 16 to determine if the absolute value between the voltage of the slow response filter $V_{OUT_2}$ and the output voltage of the fast response filter $V_{OUT_1}$ is less than the fast response to slow response threshold of 2 as described above. If so, the response time of the slow response filter is switched to its slow response mode by setting the fast response flag FALSE. The variable SUM is then calculated as described above as the product of the modulus M (i.e., 160) and $V_{O_2}$.

If the slow response filter was not found at line 15 to be in its fast response mode, the program jumps to line 19 and then checks at line 20 to determine if the absolute value of the difference between the output voltage of the slow response filters at $V_{OUT_2}$ and the output voltage of the fast response filter $V_{OUT_1}$ is greater than the low response to fast response threshold of 10, as explained above. If so, the slow response filter is switched to its fast mode by setting the fast response flag true at line 21, and the variable SUM is calculated as in line 18 except that the fast response modulus of 16 is now used to calculate SUM as the product of $V_{O_2}$ and the modulus M.

The program then progresses to line 23, where the variable $SUM_1$ is calculated as the sum of the $SUM_1$ for the previous sample and the difference between the input voltage $V_{IN}$ and the output voltage $V_{OUT_1}$ as explained in the above formulas. The output voltage of the high-pass filter $V_{OUT_1}$ is then calculated at line 24 as the ratio between the current $SUM_1$ and the fast response modulus of 16. Similarly, $SUM_2$ for the current sample is calculated as the sum of $SUM_2$ for the prior sample and the difference between the input voltage $V_{IN}$ and the output voltage of the slow response filter $V_{OUT_2}$. If the slow response filter is found at line 26 to be in its fast response mode, the output voltage of the slow response filter $V_{OUT_2}$ is calculated using the fast response modulus (i.e., 16) as the ratio of the current $SUM_2$ and the fast response modulus. Otherwise, the output voltage $V_{OUT_2}$ is calculated using the low response modulus 160 as the ratio of $SUM_2$ to the low response modulus (i.e., 160). The value of $V_{OUT_2}$ is then used as the output of the filter before looping back though line 15 to process the next sample. In this manner, the microprocessor used in the embodiment of FIG. 7 digitally implements a low response low-pass filter and a high response high-pass filter, and switches the response time of the low response low-pass filter when it fails to keep up with large changes in the input signal.

I claim:

1. A fast response time low-pass filter comprising:

a first low-pass filter receiving an input signal and outputting a first output signal, said first filter having a relatively high cutoff frequency;

a second low-pass filter receiving said input signal and outputting a second output signal that is used as an output signal for said fast response time low-pass filter, said second low-pass filter having a cutoff frequency that is changed from a relatively low frequency to a relatively high frequency in response to a control signal; and a comparator connected to said first and second filters, said comparator comparing the respective values of said first and second output signals to each other and generating said control signal when the difference between said first and second output signals exceed a predetermined value whereby said fast response time low-pass filter has a relatively low cutoff frequency until said input signal changes at a sufficient rate to cause said comparator to generate said control signal at which point the response time of said second filter changes to said relatively high cutoff frequency.

2. The low-pass filter of claim 1 wherein said comparator generates said control signal when the absolute value of the difference between said first and second output signals exceeds said predetermined value.

3. The low-pass filter of claim 1 wherein said first and second low-pass filters and said comparator are analog circuits.

4. The low-pass filter of claim 1 wherein said first and second low-pass filters and said comparator are implemented by a digital processor programmed to digitally filter said input signal and compare said first and second outputs to each other.

5. The low-pass filter of claim 1 wherein said comparator generates said control signal to change said cutoff frequency from said relatively low frequency to said relatively high frequency when the difference between said first and second output signals is greater than a first predetermined value, and said comparator terminates said control signal to change said cutoff frequency from said relatively high frequency to said relatively low frequency when the difference between said first and second output signals is within a second predetermined value.

6. The low-pass filter of claim 5 wherein said first predetermined value is greater than said second predetermined value to provide hysteresis to the changing of the cutoff frequency of said first and second low-pass filters between said relatively high frequency and said relatively low frequency.

7. The low-pass filter of claim 6 wherein said first predetermined value is approximately five times said second predetermined value.

8. The low-pass filter of claim 1 wherein said relatively high cutoff frequency is approximately ten times said relatively low cutoff frequency.

9. The low-pass filter of claim 1 wherein the relatively high cutoff frequency of said first low-pass filter is substantially equal to the relatively high cutoff frequency of said second low-pass filter.

10. A method of low-pass filtering an input signal in a manner that responds to rapid changes in said input signal, said method comprising:

low-pass filtering said input signal with a relatively high cutoff frequency to provide a first filtered signal;

low-pass filtering said input signal with a relatively low cutoff frequency to provide a second filtered signal;

comparing said first filtered signal to said second filtered signal;

if the difference between said first filtered signal and said second filtered signal exceeds a first predetermined value, increasing said relatively low cutoff frequency to a higher cutoff frequency; and using said second filtered signal as an output signal from said low-pass filtering.

11. The method of claim 10 wherein said first filtered signal is compared to said second filtered signal by comparing the absolute value of the difference therebetween so that said relatively low cutoff frequency is increased to said higher cutoff frequency when the absolute value of the difference between said first and second filtered signals exceeds said first predetermined value.

12. The method of claim 10, further including the step of decreasing said higher cutoff frequency back to said relatively low cutoff frequency if the difference between said first filtered signal and said second filtered signal is less than a second predetermined value.

13. The method of claim 12 wherein said first predetermined value is greater than said second predetermined value to provide hysteresis to changing between said relatively low cutoff frequency and said higher cutoff frequency 14. The method of claim 12 wherein said first predetermined value is approximately five times said second predetermined value.

15. The method of claim 10 wherein said higher cutoff frequency is approximately ten times said relatively low cutoff frequency.

16. The method of claim 10 wherein said steps of low-pass filtering are accomplished by analog means.

17. The method of claim 10 wherein said steps of low-pass filtering are accomplished digitally.

18. The method of claim 10 wherein said relatively high cutoff frequency is substantially equal to said higher cutoff frequency.

* * * * *